United States Patent
Zhang (10) Patent No.: US 9,736,949 B2
(45) Date of Patent: Aug. 15, 2017

(54) FLEXIBLE DISPLAY AND FLEXIBLE DISPLAY DEVICE

(71) Applicant: BOE TECHNOLOGY GROUP CO., LTD., Beijing (CN)

(72) Inventor: Yongzhong Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 95 days.

(21) Appl. No.: 14/436,755

(22) PCT Filed: Oct. 29, 2014

(86) PCT No.: PCT/CN2014/089825
§ 371 (c)(1),
(2) Date: Apr. 17, 2015

(87) PCT Pub. No.: WO2015/161635
PCT Pub. Date: Oct. 29, 2015

(65) Prior Publication Data
US 2016/0095232 A1    Mar. 31, 2016

(30) Foreign Application Priority Data

Apr. 25, 2014 (CN) .......................... 2014 1 0171682
Oct. 15, 2014 (CN) .......................... 2014 1 0545770

(51) Int. Cl.
*H05K 7/02* (2006.01)
*H05K 7/04* (2006.01)
(Continued)

(52) U.S. Cl.
CPC ........... *H05K 5/0017* (2013.01); *G06F 1/163* (2013.01); *G06F 1/1652* (2013.01); *H05K 5/0217* (2013.01)

(58) Field of Classification Search
CPC ...... G06F 1/16; G06F 1/1652; G09F 15/0087; G09F 15/0012; G09F 14/0012;
(Continued)

(56) References Cited

U.S. PATENT DOCUMENTS 7,722,245 B2    5/2010 Baba et al.
9,173,288 B1 *  10/2015 Kim ..................... G06F 1/1633
(Continued)

FOREIGN PATENT DOCUMENTS

CN         101064075 A    10/2007
CN         101159108 A    4/2008
(Continued)

OTHER PUBLICATIONS

Chinese Office Action in Chinese Application No. 201410545770.4 mailed May 6, 2016 with English translation.
(Continued)

*Primary Examiner* — Hung S Bui
(74) *Attorney, Agent, or Firm* — Collard & Roe, P.C.

(57) ABSTRACT

A flexible display (5) and a flexible display device are disclosed. The flexible display (5) includes a flexible display body on which a support body structure (3) is configured to provide supporting when the flexible display body is in wrapped state or un-wrapped state. The flexible display (5) and display device can prevent over-bending of a display substrate by the strength of the substrate, and can also automatically keep the display substrate flat when unwrapped, and prevent damage of the display substrate due to the over bending, and can also be worn on wrist conveniently.

19 Claims, 5 Drawing Sheets

(51) Int. Cl.
*H05K 5/00* (2006.01)
*H05K 5/02* (2006.01)
*G06F 1/16* (2006.01)

(58) Field of Classification Search
CPC ............. H05K 5/0017; H05K 51/0281; H05K 7/02954; Y02E 10/721; G03B 21/58; H04M 1/725
USPC .......................................................... 361/807
See application file for complete search history.

(56) References Cited

U.S. PATENT DOCUMENTS

| | | | |
|---|---|---|---|
| 2004/0247386 A1* | 12/2004 | Sugiyama | F16B 5/02 403/408.1 |
| 2008/0084657 A1* | 4/2008 | Baba | G04G 17/08 361/679.01 |
| 2008/0130421 A1* | 6/2008 | Akaiwa | G04G 9/00 368/82 |
| 2013/0258565 A1 | 10/2013 | Nishi | |
| 2014/0003006 A1 | 1/2014 | Ahn | |
| 2014/0118910 A1* | 5/2014 | Sung | G09F 9/301 361/679.01 |
| 2014/0340858 A1 | 11/2014 | Eom | |
| 2016/0034742 A1* | 2/2016 | Kim | H04B 1/385 382/124 |
| 2016/0070367 A1* | 3/2016 | Lin | G06F 3/0383 345/158 |
| 2016/0098132 A1* | 4/2016 | Kim | G06F 3/0412 345/173 |

FOREIGN PATENT DOCUMENTS

| | | |
|---|---|---|
| CN | 103366641 A | 10/2013 |
| CN | 103514812 A | 1/2014 |
| CN | 103971603 A | 8/2014 |
| CN | 103988244 A | 8/2014 |
| CN | 203786602 U | 8/2014 |
| CN | 203825958 U | 9/2014 |
| GB | 2508194 A | 5/2014 |
| WO | 2013/069970 A1 | 5/2013 |

OTHER PUBLICATIONS

International Search Report of PCT/CN2014/089825 in Chinese with English translation, mailed Feb. 4, 2015.
Notice of Transmittal of the International Search Report of PCT/CN2014/089825 in Chinese, mailed Feb. 4, 2015.
Written Opinion of the International Searching Authority of PCT/CN2014/089825 in Chinese with English translation, mailed Feb. 4, 2015.

* cited by examiner

FLEXIBLE DISPLAY AND FLEXIBLE DISPLAY DEVICE

CROSS REFERENCE TO RELATED APPLICATIONS

This application is the National Stage of PCT/CN2014/089825 filed on Oct. 29, 2014, which claims priority under 35 U.S.C. §119 of Chinese Application No. 201410171682.2 filed Apr. 25, 2014 and of Chinese Application No. 201410545770.4 filed on Oct. 15, 2014, the disclosure of which is incorporated by reference.

TECHNICAL FIELD

Embodiments of the present disclosure relate to a flexible display and a flexible display device.

BACKGROUND

With the development of flat panel display (FPD), as for achieving the curved surface display of large-sized panels pursuing vivid sense of presence, flexibility of winding type mobile terminals pursuing portability and convenience, substrates with both flexibility and impact resistance are indispensible. As for a FPD substrate, glass substrates or materials such as polyimide resin are widely used. However, a flexible substrate is easily over bent, which causes crack or damage or falling off of inner devices, and further affects characteristic and service life.

SUMMARY

Embodiments of the present disclosure provide a flexible display, comprising: a flexible display body on which a support body structure is configured to provide supporting when the flexible display body is in a wrapped state or an un-wrapped state, wherein the support body structure includes a support body and the support body includes material having shape memory function.

In an example, the support body is a long strip sheet and has a length direction which is consistent with the flexible direction of the display body.

In an example, the support body is made of spring material, and can be wrapped and un-wrapped in the length direction and can also be warped or un-wrapped in a width direction, wherein the warping in the width direction and the wrapping in the length direction are towards different sides.

In an example, the warping of the support body in the width direction refers to the edge portion of the support body in the width direction can be warped and unwrapped, while the middle portion in the width direction is unwrapped all the time.

In an example, the warping of the support body in the width direction refers to that the support body can be configured to be warped and unwrapped as a whole in the width direction.

In an example, the middle portion of the support body in the width direction is configured to have an wrapped tendency in the length direction, and the edge portion of the support body in the width direction is configured to have a warping tendency in the width direction while have an unwrapped tendency in the length direction.

In an example, the display body includes a base substrate, wherein a first surface of the base substrate is provided with a groove, and the support body is accommodated in the groove.

In an example, the groove has a width adaptive with that of the support body in an unwrapped state, and the groove has a depth adaptive with the height of the support body in the warping state.

In an example, the groove has a length slightly larger than that of the support body.

In an example, the display body includes a flexible block member mounted on the base substrate so as to block the support body within the groove.

In an example, the support body is only located at one end or two ends of the display body in a non-wrapping direction and corresponds to a non-display area of the flexible display.

In an example, the support body structure includes more than three support bodies and the more than three support bodies are disposed in parallel in a non-display area corresponding to the flexible display.

In an example, the support body structure includes a plurality of support bodies located in positions corresponding to a non-display area of the flexible display and the plurality of support bodies are arranged into a plurality of rows in parallel, the plurality of support bodies in each row are arranged end-to-end and a space between adjacent support bodies is formed, and the space formed between a row of support bodies and the space formed between adjacent rows of the support bodies are arranged alternately.

In an example, the material of alloy having memory function includes Au—Cd, Ag—Cd, Cu—Zn, Cu—Zn—Al, Cu—Zn—Sn, C—Zn—Si, Cu—Sn, Cu—Zn—Ga, In—Ti, Au—Cu—Zn, Ni—Al, Fe—Pt, Ti—Ni, Ti—Ni—Pd, Ti—Nb, U—Nb or Fe—Mn—Si.

Embodiments of the present application provide a flexible display device, including the above flexible display, an arm belt connected with the display body, wherein the arm belt is connected with the display body via a hinge, the hinge includes a seat body and a rotating member which are snapped together and can rotate relative to each other, and one of the seat body and the rotating member is fastened to the flexible display while the other one is fastened to the arm belt.

In an example, the seat body of the hinge includes a cylindrical jacket portion and at least one block portion protruding inwardly from the jacket portion, the rotating member includes a base portion, more than two elastic portions protruding from the base portion and more than two catchers protruding outwardly from the elastic portions, and the seat body and the rotating member are snapped together by the cooperation between the catchers and the block portions.

In an example, the arm belt is provided with a support body configured to provide supporting when the display body is in wrapped state or un-wrapped state, wherein the support body is made of a spring material, and can be wrapped and unwrapped in a length direction and can be warped and unwrapped in a width direction, and the warping in the width direction and the wrapping in the length direction are towards different sides.

In an example, the arm belt includes more than two belt bodies.

BRIEF DESCRIPTION OF THE DRAWINGS

FIG. 5b is a schematic diagram of the flexible display device in an unwrapped state shown in FIG. 5a;

DETAILED DESCRIPTION

The technical solutions of the embodiments of the present disclosure will be described in a clearly and fully understandable way in connection with the drawings related to embodiments of the disclosure. Apparently, the described embodiments are just a part but not all of the embodiments of the disclosure. Based on the described embodiments herein, those skilled in the art can obtain other embodiment(s), without any inventive work, which shall fall within the protection scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present application, are not intended to indicate any sequence, amount or importance, but for distinguishing various components. Also, the terms, such as "a/an," "one," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

The flexible display using the flexible substrate has lots of advantages while also has disadvantages as follow: to unwrap as needed and adjust the wrapping situation at will, a special support needs to be designed to support the flexible display in different states, but usual designs render complex support structures which also occupy large space; and it is even hardly to design such an appropriate support.

Embodiments of the present disclosure provide a flexible display, wherein the flexible display can prevent crack or damage, or falling off of inner devices caused by over bending so as to prolong service life, and can be kept in the unwrapped state without being supported by a special support.

In order to make one skilled in the art better understand the technical solutions of the present disclosure, the present disclosure is further described in detail in conjunction with the drawings and the embodiments.

Embodiment 1

Figure 1A:
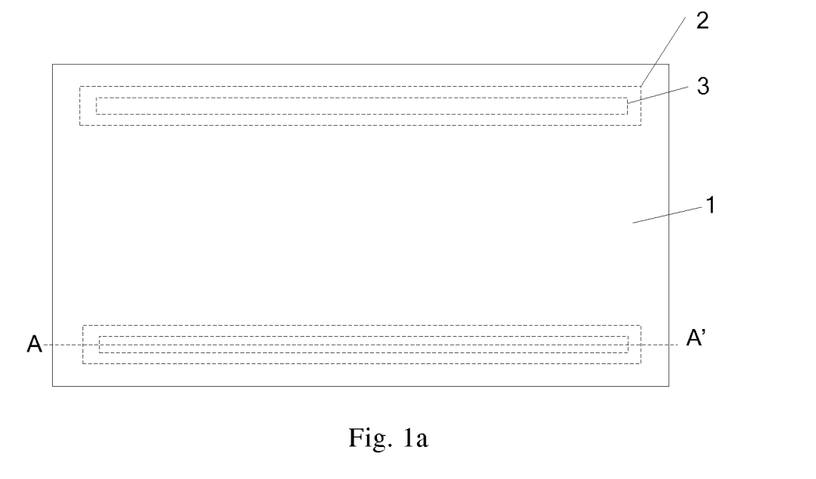
FIG. 1a is a schematic diagram of a flexible display in an un-wrapped state according to an embodiment of the present disclosure.
Figure 1B:
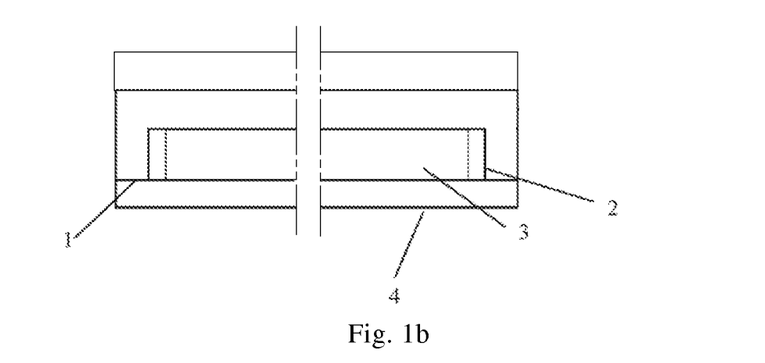
FIG. 1b is a sectional schematic diagram of FIG. 1a along A-A' direction.

Embodiment 1 of the flexible display of the present disclosure as shown in FIGS. 1a and 1b includes a flexible display body, the display body includes a base substrate 1 made of a flexible material, and the base substrate 1 has two grooves 2. As shown in FIG. 1a, the two grooves 2 are respectively located in two ends (the grooves 2 can also be disposed in only one end when the flexible display is small) of the display body in a non-bending direction and correspond to the non-display area of the flexible display (i.e., area other than the display area). In embodiment 1, the base substrate is in a rectangular shape, for example, the bending direction of the flexible display refers to the direction along the long side of the rectangle, while the flexible display can not be bent in the direction corresponding to the short side of the rectangle. A support body 3 is disposed in the two grooves 2, respectively. The grooves 2 that receive the support body 3 have to match the size of the support body 3 in both the width direction and the depth direction, so that the grooves 2 can effectively receive the support body 3 when the support body 3 is warped or unwrapped in a width direction. For example, the width of the grooves 2 can be configured to adapt with the width of the support body 3 in the unwrapped state, and the depth of the grooves 2 can be configured to adapt with the height of the support body 3 in the warped state; or the material for forming the main body of the grooves 2 has corresponding flexibility. The display body further includes a flexible and plate-like block member 4, which is fixedly mounted on the base substrate 1 by adhesive attachment (other fixing ways can also be used) so as to block the support body 3 within the grooves 2. In the present example, the support body 3 is only disposed in the non-display area of the flexible display, which can prevent that the uneven surface of the flexible substrate material affects the formation of other electronic structures during fabrication.

For example, as shown in FIG. 1a, the edge of the support body 3 and the side walls of the grooves 2 have a small gap, i.e., the length of the grooves 2 is slightly larger than the length of the support body 3, and the gap can prevent that the support body 3 extrudes the side walls of the grooves 2 and then further affects normal supporting due to different coefficients of thermal expansion of elements on the substrate in use. The support body 3 can adopt shape memory alloy materials, such as Au—Cd, Ag—Cd, Cu—Zn, Cu—Zn—Al, Cu—Zn—Sn, Cu—Zn—Si, Cu—Sn, Cu—Zn—Ga, In—Ti, Au—Cu—Zn, Ni—Al, Fe—Pt, Ti—Ni, Ti—Ni—Pd, Ti—Nb, U—Nb or Fe—Mn—Si. Due to the support function of the support body 3, the flexible display body can obtain effective support either in the unwrapped state or the wrapped state. Using the alloy material having shape memory function as the base substrate 1 of the support body 3 can achieve the flexible display, and can also appropriately set the bending degree of the flexible display in a wrapped state to prevent damaging the display due to over bending, and can additionally automatically keep the flatness of the display substrate in the unwrapped state. According to actual needs, the flexible display may not present a completely flat state in the unwrapped state, and can also present a certain bending shape partially or integrally.

The base substrate 1 in embodiment 1 is described by taking the rectangular shape as an example, but the base substrate of the present disclosure is not limited to the rectangular shape, and it can also be in other shapes, such as square, parallelogram, polygon, elliptical or circular shape. The structure and material of the support body 3 can be similar to the frame of the Brian circle.

Embodiment 2

Figure 2:
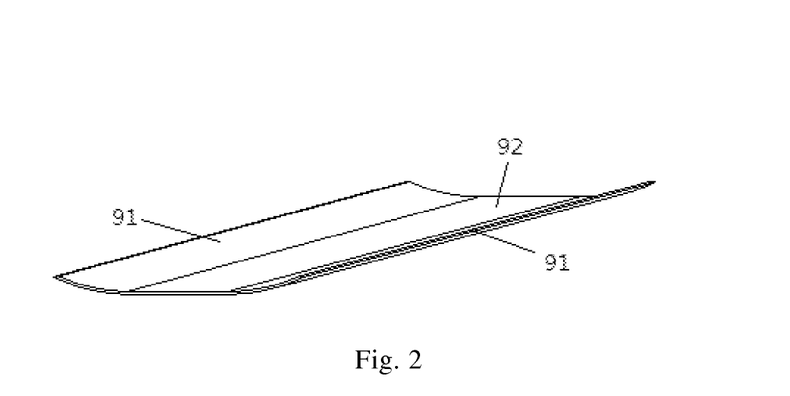
FIG. 2 is a structural schematic diagram of the support body according to an embodiment of the present disclosure.

Embodiment 2 of the present disclosure provides a support body of a flexible display, as shown in FIG. 2, the support body is made of a spring material, for example, manganese steel, which is substantially a long stripped sheet, and an edge portion 91 of the support body in the width direction is configured to have a warping tendency and has an unwrapping tendency in the length direction, while a middle portion 92 of the support body in the width direction is configured to have a wrapping tendency (the wrapped curvature can be set or designed) in the length direction, so that it can be unwrapped or wrapped in the length direction and can also be warped or unwrapped in the width direction, and the warping in the width direction and the wrapping in the length direction are toward different sides of the sheet. Since the wrapped curvature of the support body 3 in the length direction can be set, the support body 3 that adopts such structure can prevent the problem that "crack or damage or falling off of inner devices due to over bending of the display substrates" and extend the service life. The working principles of the support body 3 are as follows: the support body 3 will be in a warping state in the width direction when it is in an unwrapped state in the length direction, and an inner pulling stress generated by warping counteracts the stress due to the wrapping tendency in the length direction, thereby a balance is achieved; while under an external force (human power), when the support body is unwrapped in the length direction, it will be unwrapped in the width direction and thereby the ability of counteracting the stress for generating the wrapping tendency in the length direction weakens due to the unwrapping, thus another balance state is kept. Under an external force (human power), when the support body is unwrapped in the length direction, it will return to the warping state in the width direction, and thereby a balance in the unwrapped state is achieved. Thus, the support body can achieve a function like the shape memory function, and constitutes the material having a similar shape memory function.

The support body can be configured such that the edge portion 91 in the width direction can be warped or unwrapped, while the middle portion 92 in the width direction is unwrapped all the time, as shown in FIG. 2. The support body can also be configured to be able to be warped or unwrapped in the width direction as a whole.

The support body is made of a spring material, such as manganese steel, thus the cost is reduced greatly.

Embodiment 3

Figure 3:
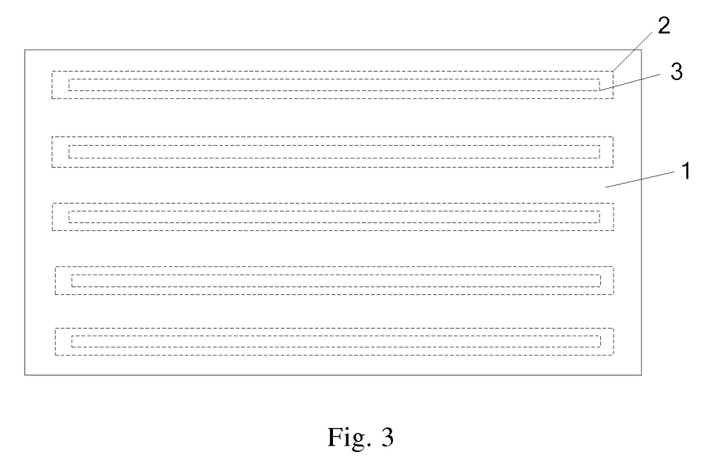
FIG. 3 is a schematic diagram of the flexible display in an un-wrapped state according to another embodiment of the present disclosure.

The main difference between the embodiment 3 of the flexible display as shown in FIG. 3 and the above embodiment 1 of the present disclosure lies in: the base substrate 1 is arranged with five grooves 2 thereon in parallel, and the grooves 2 are arranged in parallel in the bending direction of the flexible substrate. The support body 3 is disposed in the grooves 2 and a plurality of support bodies are arranged in parallel. Through disposing five support bodies, the force is more uniform and the ability of shape recovery of the display body is enhanced and the unwrapping and the wrapping ability is kept.

Embodiment 4

Figure 4:
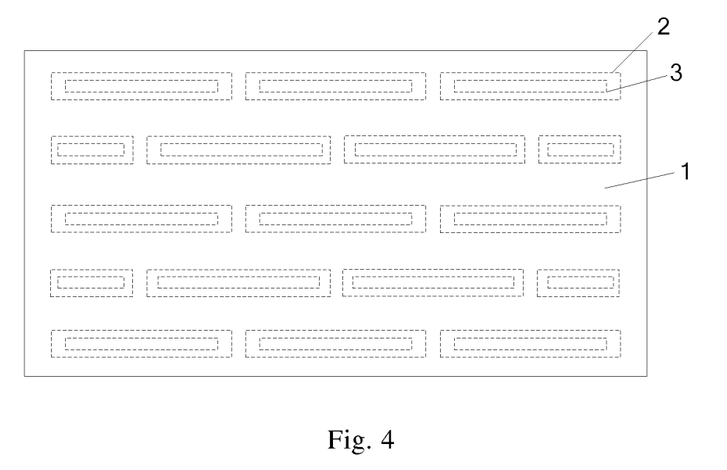
FIG. 4 is a schematic diagram of the flexible display in an un-wrapped state according to yet another embodiment of the present disclosure.

The main difference between the embodiment 4 of the flexible display as shown in FIG. 4 and the above embodiments 1 and 3 of the present disclosure lies in: a plurality of support bodies 3 are arranged in parallel and in a plurality of rows, the plurality of support bodies 3 in each row are arranged end-to-end and a space is provided between adjacent support bodies 3, and the space formed between a row of support bodies 3 and the space formed between adjacent rows of the support bodies 3 are in alternative arrangement, and the support bodies 3 are arranged in the grooves 2, respectively. Such an arrangement of the support bodies 3 can enhance the ability of environmental adaption of the display substrate, and can be used in different temperature environments, and thus the bending adaptability is better.

The support body 3, besides the shapes as described in the above embodiments, can also be in an integral plate-like structure made of a shape memory alloy (SMA).

Embodiment 5

Figure 5A:
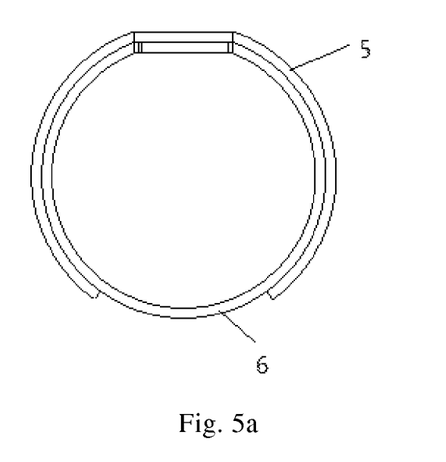
FIG. 5a is a schematic diagram of the flexible display device in a wrapped state according to a further embodiment of the present disclosure.
Figure 5B:
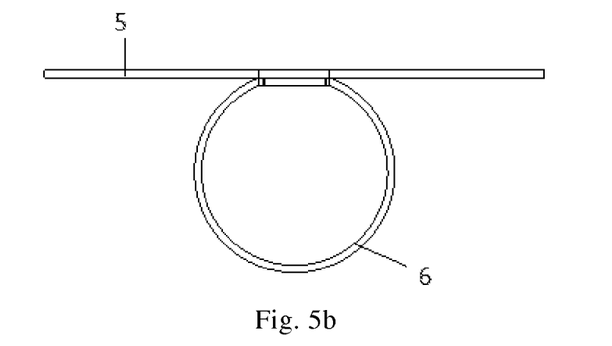
Figure 6:
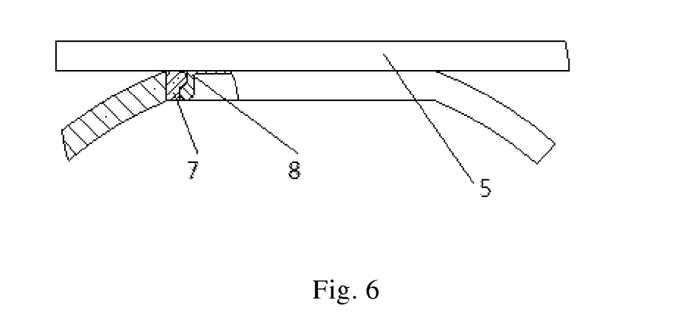
FIG. 6 is a schematic diagram of the connection between an arm belt and the flexible display body.

FIGS. 5*a* and 5*b* are schematic views of the flexible display device according to the embodiment of the present disclosure. The flexible display device includes a flexible display 5 and an arm belt 6 connected with the flexible display 5. FIG. 5*a* shows that the flexible display 5 is in an unwrapped state, and FIG. 5*b* shows that the flexible display 5 is in a wrapped state. The arm belt 6 is connected with the flexible display via a hinge, and two ends of the arm belt 6 are respectively connected with one side of the hinge. As shown in FIG. 6, the hinge includes a seat body 7 and a rotating member 8 which are snapped together or engaged with each other and can rotate relative to each other. One of the seat body 7 and the rotating member 8 is fastened to the flexible display 5 while the other one is fastened to the arm belt 6. The seat body 7 in the present example is fastened to the flexible display 5 and the rotating member 8 is fastened to the arm belt 6.

Figure 7:
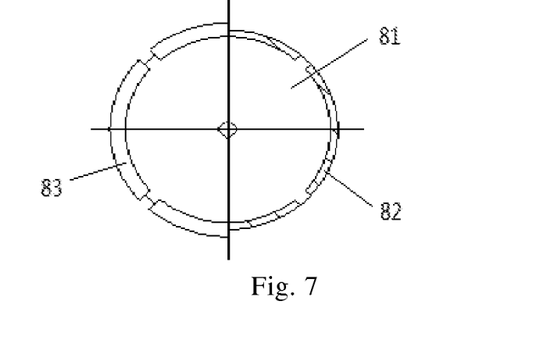
FIG. 7 is a bottom half-sectional view of a rotor in a hinge.
Figure 8:
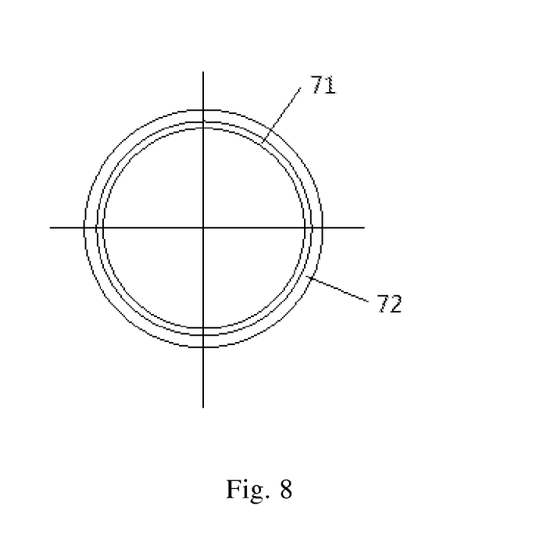
FIG. 8 is a bottom view of the seat body of the hinge.
Figure 9:
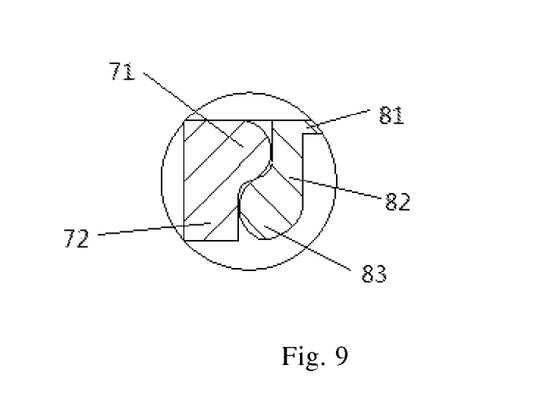
FIG. 9 is partial sectional diagram of the hinge portion in FIG. 6.

As shown in FIGS. 7, 8 and 9, the seat body 7 of the hinge includes a cylindrical jacket portion 72 and a block portion 71 protruding inwardly from the jacket portion 72. The block portion 71 can include one or a plurality of sections. For example, the block portion can be in a circular shape formed by an integral jacket portion 72 protruding inwardly, or it can include a plurality of sections in an arc shape and arranged in a ring. The rotating member 8 includes a base portion 81 in a disc shape (or a cylindrical shape or barrel shape), four (which can also be two, three or more than five) elastic portions 82 protruding from the base portion and presenting an arc shaped cross-section and catchers 83 protruding outwardly from the elastic portions 82. For example, each elastic portion 82 is formed with one or more than two catchers 83 thereon, or a portion of the elastic portions 82 is formed with one or more than two catchers 83. The seat body 7 and the rotating member 8 are snapped together or engaged with each other by the cooperation between the catchers 83 and the block portions 71.

In order to dispose the flexible display more stably on an arm, the arm belt 6 can include more than two belt bodies in parallel.

Embodiment 6

Figure 10:
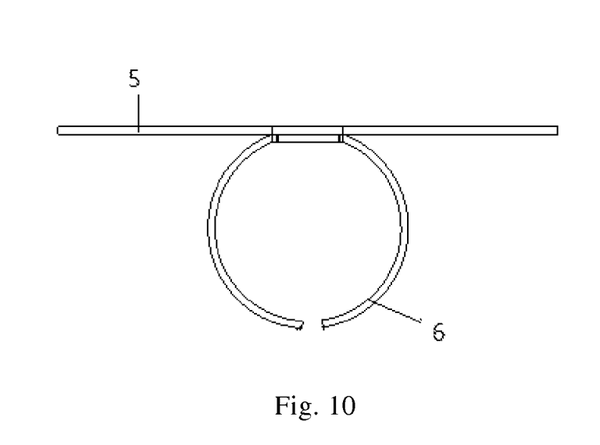
FIG. 10 shows a flexible display device having the arm belt with a gap.

The main difference between the embodiment 6 of the flexible display as shown in FIG. 10 and the above embodiment 5 of the present disclosure lies in: there are two arm belts 6, and each of the arm belts 6 has one end fixedly connected with one side of the hinge. The arm belts 6 can include a strip structure formed by a memory alloy, or a skeleton structure similar to the Brian circle, or the arm belt 6 is disposed with the support body as described in embodiment 2.

The flexible display provided by the embodiment of the present disclosure can realize flexible display and can also keep the flexible display device in the unwrapped or wrapped state satisfactorily by using the material having a shape memory function in the support body, thus the display substrate can be supported in the unwrapped state, and the problem of crack or damage or falling of inner devices due to over bending of the display substrate is also avoided, thus the service life of the display is prolonged; and the display device can be kept in the unwrapped state without being supported by a special support. The flexible display device provided by the embodiments of the present disclosure can be worn on one's wrist conveniently.

It is understood that the embodiments described above are just exemplary ones of the present disclosure for describing the principles of the present disclosure, while the present disclosure are not limited to those. For one skilled in the art, various variations and modifications can be made without departing from the spirit and substance of the present invention, and such variations and modifications shall also fall within the scope of protection of the present invention.

What is claimed is:

1. A flexible display, comprising a flexible display body on which a support body structure is configured to provide supporting when the flexible display body is in wrapped state or un-wrapped state, wherein the support body structure includes a support body and the support body includes material with shape memory function; and
    wherein the support body structure includes a plurality of support bodies located in positions corresponding to a non-display area of the flexible display and the plurality of support bodies are arranged into a plurality of rows in parallel, the plurality of support bodies in each row are arranged end-to-end and a space between adjacent support bodies is formed, and the space formed between a row of support bodies and the space formed between adjacent rows of the support bodies are arranged alternately.

2. The flexible display according to claim 1, wherein the support body is a long strip sheet and has a length direction which is consistent with a flexible direction of the display body.

3. The flexible display according to claim 2, wherein the support body is made of spring material, and can be wrapped and un-wrapped in the length direction and can also be warped or un-wrapped in a width direction, wherein the warping in the width direction and the wrapping in the length direction are towards different sides.

4. The flexible display according to claim 2, wherein the display body comprises a base substrate, and a first surface of the base substrate is provided with a groove, and the support body is accommodated in the groove.

5. The flexible display according to claim 1, wherein the support body is made of spring material, and can be wrapped and un-wrapped in the length direction and can also be warped or un-wrapped in a width direction, wherein the warping in the width direction and the wrapping in the length direction are towards different sides.

6. The flexible display according to claim 5, wherein the warping of the support body in the width direction refers to that the edge portion of the support body in the width direction can be warped and unwrapped, while the middle portion in the width direction is unwrapped all the time.

7. The flexible display according to claim 5, wherein the warping of the support body in the width direction refers to that the support body can be configured to be warped and unwrapped as a whole in the width direction.

8. The flexible display according to claim 1, wherein the middle portion of the support body in the width direction is configured to have an wrapping tendency in the length direction, and the edge portion of the support body in the width direction is configured to have a warping tendency in the width direction while have an unwrapping tendency in the length direction.

9. The flexible display according to claim 1, wherein the display body comprises a base substrate, and a first surface of the base substrate is provided with a groove, and the support body is accommodated in the groove.

10. The flexible display according to claim 9, wherein the groove has a width adaptive with that of the support body in an unwrapped state, and the groove has a depth adaptive with the height of the support body in the warping state.

11. The flexible display according to claim 9, wherein the groove has a length slightly larger than that of the support body.

12. The flexile display according to claim 1, wherein the display body comprises a flexible block member which is mounted on the base substrate so as to block the support body within the groove.

13. The flexible display according to claim 1, wherein the support body is only located at one end or two ends of the display body in a non-bending direction and corresponds to a non-display area of the flexible display.

14. The flexible display according to claim 1, wherein the support body structure includes more than three support bodies and the more than three support bodies are disposed in parallel in a non-display area corresponding to the flexible display.

15. The flexible display according to claim 1, wherein the material with shape memory function includes Au—Cd, Ag—Cd, Cu—Zn, Cu—Zn—Al, Cu—Zn—Sn, Cu—Zn—Si, Cu—Sn, Cu—Zn—Ga, In—Ti, Au—Cu—Zn, Ni—Al, Fe—Pt, Ti—Ni, Ti—Ni—Pd, Ti—Nb, U—Nb or Fe—Mn—Si.

16. A flexible display device, comprising the flexible display according to claim 1, and an arm belt connected with the display body, wherein the arm belt is connected with the display body via a hinge, the hinge includes a seat body and a rotating member which are snapped together and can rotate relative to each other, and one of the seat body and the rotating member is fastened to the flexible display while the other one is fastened to the arm belt.

17. The flexible display device according to claim 16, wherein the seat body of the hinge includes a cylindrical jacket portion and at least one block portion protruding inwardly from the jacket portion, the rotating member includes a base portion, more than two elastic portions protruding from the base portion and more than two catchers protruding outwardly from the elastic portions, and the seat body and the rotating member are snapped together by the cooperation between the catchers and the block portions.

18. The flexible display device according to claim 17, wherein the arm belt is provided with a support body configured to provide supporting when the display body is in wrapped state or un-wrapped state, wherein the support body is made of a spring material, and can be wrapped and unwrapped in a length direction and can be warped and unwrapped in a width direction, and the warping in the width direction and the wrapping in the length direction are towards different sides.

19. The flexible display device according to claim 16, wherein the arm belt includes more than two belt bodies.

* * * * *